(12) United States Patent
Mathai et al.

(10) Patent No.: US 8,793,298 B2
(45) Date of Patent: Jul. 29, 2014

(54) RECONFIGURABLE DIGITAL SIGNAL FILTER PROCESSOR

(75) Inventors: Nebu John Mathai, Waterloo (CA); Oleksiy Kravets, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 825 days.

(21) Appl. No.: 12/917,022

(22) Filed: Nov. 1, 2010

(65) Prior Publication Data

US 2012/0110051 A1 May 3, 2012

(51) Int. Cl.
*G06F 17/10* (2006.01)
(52) U.S. Cl.
USPC .......................... 708/316; 708/300; 708/322
(58) Field of Classification Search
None
See application file for complete search history.

(56) References Cited

U.S. PATENT DOCUMENTS

| | | | |
|---|---|---|---|
| 5,487,023 A | | 1/1996 | Seckora |
| 6,009,445 A | * | 12/1999 | Tsyrganovich ............... 708/300 |
| 2002/0049797 A1 | | 4/2002 | Temerinac |
| 2003/0195910 A1 | * | 10/2003 | Corless et al. ................ 708/322 |

FOREIGN PATENT DOCUMENTS

| | | |
|---|---|---|
| EP | 623996 A1 | 11/1994 |
| WO | 2010026064 A1 | 3/2010 |

OTHER PUBLICATIONS

Torres L et al: A reconfigurable digital filter chip for image processing, ASIC/SOC Conference, 1999 (Sep. 15, 199), pp. 93-97, XP010360316, DOI: D0I:10.1109/ASIC. 1999.806482 ISBN: 978-0-7803-5632-0. Abstract; p. 93; Figure 1; p. 95; Figure 6; p. 96-p. 97; Figure 8.
European Search Report from corresponding EP Application dated Apr. 27, 2011.
Ramanathan S K Nandy and V Visvanathan—Reconfigurable Filter Coprocessor Architecture for DSP Applications—Nov. 2000—Abstract.
Hatamian M Parhi—An 85-MHz-fourth-order programmable IIR digital filter chip, Feb. 1992.
Vladimir M Poucki—Chebyshev IIR Filter Sharpening Implemented on FPGA, Nov. 2008.

* cited by examiner

*Primary Examiner* — Michael D Yaary
(74) *Attorney, Agent, or Firm* — Gowling Lafleur Henderson LLP (57) ABSTRACT

A reconfigurable digital signal filter processing unit for use in a communication device is provided. The reconfigurable filters processor can implement different filter topologies to adapt to a range or wireless technology characteristics. The reconfigurable filter processor comprises a plurality of filter blocks whose inputs can be selected based on the desired configuration of the filter. Each filter block applies a transfer function to a received signal to achieve a desired filtering function.

20 Claims, 11 Drawing Sheets

RECONFIGURABLE DIGITAL SIGNAL FILTER PROCESSOR

TECHNICAL FIELD

The description relates to a filter processor for use in wireless devices and in particular to a filter processor having a reconfigurable data pathway.

BACKGROUND

In communication technologies, such as wireless communication, various digital filtering functions are required in digitally processing received signals to extract data. Filter processors or processing units are used for filtering the received signals and are selected based on the filtering requirements of the wireless communication technology. Filtering may be done on an analog signal or a digital signal, typically using an infinite impulse response (IIR) filter or a finite impulse response (FIR) filter.

Various filter components may be combined to provide an overall desired transfer function to be applied to the received signals. The transfer function of a filter may be a first order, or higher order, transfer function. Typically, filters are configurable by changing values of parameters such as coefficients of the transfer function.

Although varying the coefficients of filters allows the characteristic of the filter to be tuned for different conditions, it is not possible to modify the overall topology of the filter. The possible connections between filter components defining the overall filter topology is set at design time, or when configuring the processor such as when powering on the processor in the case of a field programmable gate array (FPGA). It has not been possible to modify the overall filter topology of the filter to adequately adapt to a range or communication technologies in a single digital signal processing unit.

Therefore, there is a need for a filter processor capable of reconfiguring the filtering characteristics to adapt to a range of communication technologies.

BRIEF DESCRIPTION OF THE DRAWINGS

Embodiments of a reconfigurable digital signal filter processor or processing unit will be described with reference to the appended drawings, in which.

DETAILED DESCRIPTION

In accordance with the description there is provided a reconfigurable digital signal filter processing unit comprising: an input filter block for applying an input transfer function to an input to the reconfigurable digital signal filter processing unit and generating a filter block output according to the input transfer function; a plurality of filter blocks each for applying a transfer function to a filter block input and generating a filter block output according to the respective transfer function; a combiner for selectively combining filter block outputs from at least two filter blocks of the plurality of filter blocks and generating a combiner output; wherein the respective filter block input of each of the plurality of filter blocks is selectively coupled to: a filter block output of one of the plurality of filter blocks or the filter block output of the input filter block; or the combiner output.

In accordance with the description there is provided a reconfigurable digital signal filter processing unit for producing a filtered output from an input, the processor comprising: a first filter block coupled the input and providing an output ($U_0$) according to a first transfer function; a second filter block selectably receiving one of $U_0$ and an alternate input ($Y_c$) and providing an output ($U_n$) according to a second transfer function; a third filter block selectably receiving one of the input and $U_n$ and providing an output ($L_0$) according to a third transfer function; a fourth filter block selectably receiving one of $L_0$ and $U_n$ and providing an output ($L_1$) according to a fourth transfer function; and a combiner selectably combining $U_0$ with $L_0$ or $U_1$ with $L_1$ to provide the alternate input Yc, the alternate input Yc coupled to the output.

In accordance with the description there is provided a method of reconfiguring a digital signal filter processing unit comprising: receiving an input indicating an order of a lattice wave digital filter (LWDF) section and a serial cascaded filter section; determining a plurality of control signals required for coupling a plurality of filter blocks together to provide the filter sections specified by the input; and applying the determined control signals to respective filter block multiplexers, each filter block multiplexer associated with one of the plurality of filter blocks and for selecting an input of the filter block.

Figure 1:
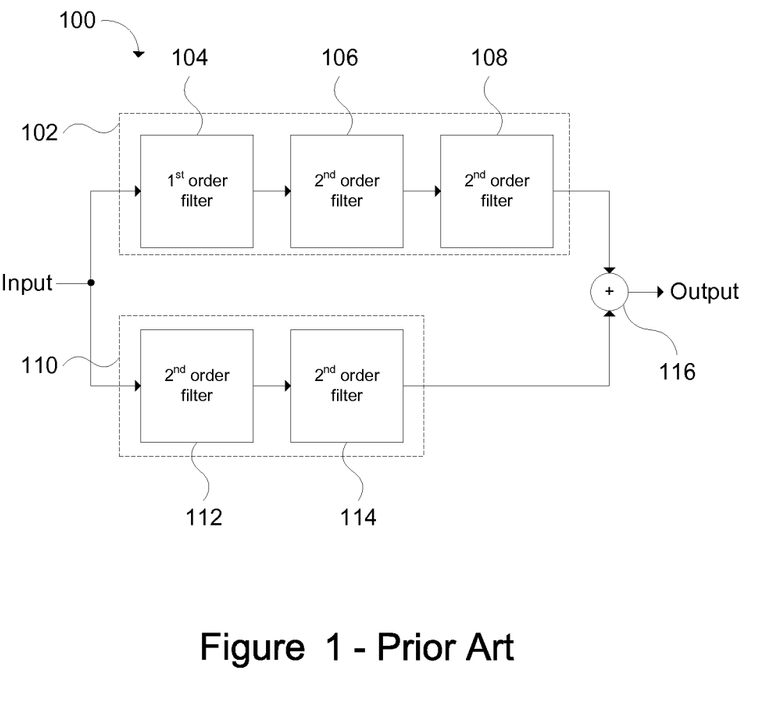
FIG. 1 depicts in a block diagram a Lattice Wave Digital Filter topology.

FIG. 1 depicts a filter topology commonly referred to as a Lattice Wave Digital Filter (LWDF). The LWDF 100 comprises a parallel connection of two filter branches, which may be referred to as an upper branch 102 and a lower branch 110. As depicted in FIG. 1, the same input is provided to each of the upper branch 102 and the lower branch 110. An adder 116 adds the output from each of the upper branch 102 and the lower branch 110 together to provide the output. The adder may add ½ of the output from each of the upper branch 102 and the lower branch 110. It will be appreciated that the terms 'upper' and 'lower' are relative to the layout of the block diagram, and no specific physical relationship is implied with regards to the layout of the branches.

As depicted in FIG. 1, each of the upper branch 102 and lower branch 110 comprise a cascaded connection of filter blocks. The upper branch 102 comprises a cascaded connection of three filter blocks 104, 106, 108. The first filter block 104 in the upper branch 102 is a first order filter block. Each of the second filter block 106 and the third filter block 108 in the upper branch 102 is a second order filter block. Each of the filter blocks 112, 114 in the lower branch 110 is a second order filter block.

Although not depicted in FIG. 1, each filter block of the LWDF 100 comprises one or more parameters that may be set and/or modified to tune the performance of the LWDF 100. Although the parameters may be modified the overall topology of the LWDF 100 and the connections between filter blocks cannot be modified.

Although the LWDF 100 filter topology provides adequate filtering for certain applications, it may prove less than ideal for other applications. For example, the LWDF 100 is non-linear with respect to the phase response. This phase non-linearity may be unsuitable for filtering in Long Term Evolution (LTE) environments.

Figure 2:
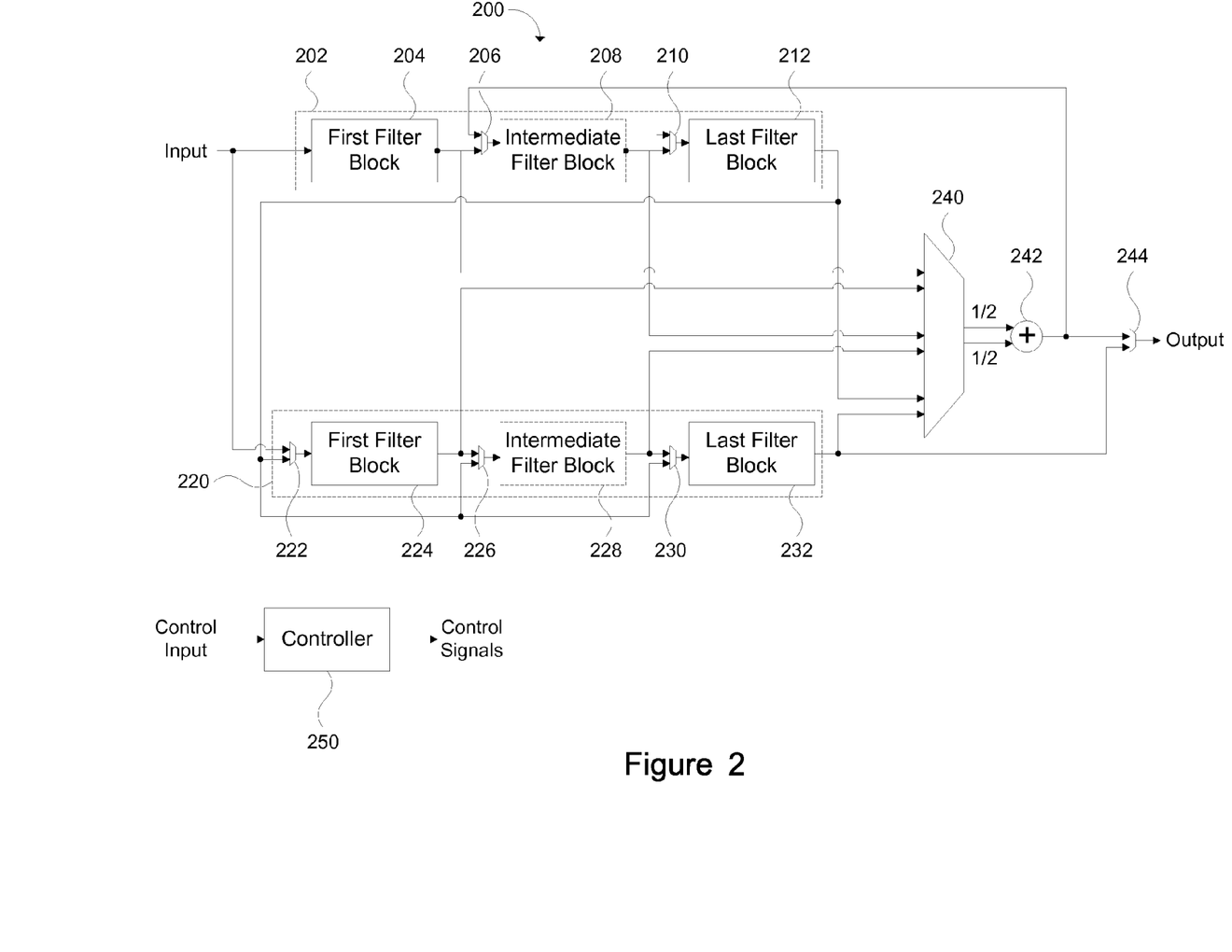
FIG. 2 depicts in a block diagram components of a reconfigurable filter processor.

FIG. 2 depicts in a block diagram components of a reconfigurable filter processor. The reconfigurable filter processor 200 enables the overall topology of the filter processor 200 to be changed, in addition to the setting and/or changing parameters of the individual filter blocks. The reconfigurable filter processor 200 comprises an upper branch 202 of filter blocks and a lower branch 220 of filter blocks. A combiner combines outputs from the filter blocks. The combiner may comprise a multiplexer 240 that selects pairs of outputs from the upper branch 202 and the lower branch 220 and provides the selected outputs to an adder 242 that combines the selected branch outputs, or more particularly ½ of each selected branch output. The output of the adder 242 is provided to an output multiplexer 244 that selects the output for the reconfigurable filter processor 200. The output from the last filter block of the lower branch 220 is also provided to the output multiplexer 244. Although depicted as part of the reconfigurable filter processor 200, the output multiplexer may be provided as a separate component. The reconfigurable processor may provide one or more outputs such as, the output from the adder 242 and the output from the last filter block of the lower branch 220.

As depicted in FIG. 2, each of the upper branch 202 and the lower branch comprise a plurality of corresponding filter blocks. The upper branch 202 comprises a first filter block 204 that is coupled to the input of the filter. As described further with reference to FIG. 3, the first filter block 204 may be coupled to the input of the filter through one or more input filter blocks. The lower branch 220 comprises a corresponding first filter block 224 that can be selectively coupled to the input of the filter by an input multiplexer 222. The input multiplexer 222 may also be coupled to the output from the upper branch 202. As described further with reference to FIG. 3, the input multiplexer 222 may be coupled to the output of the upper branch 202 through one or more input filter blocks.

Each of the upper branch 202 and the lower branch 220 also comprise corresponding last filter blocks 212, 232. The last filter block 212 of the upper branch 202 may be selectively coupled to the output of a previous filter block of the upper branch 202 or the output of the adder 242 through multiplexer 210. The last filter block 232 of the lower branch 220 may be selectively coupled to the output of a previous filter block of the lower branch 220 or the output of the upper branch 202 through multiplexer 230.

Each of the upper branch 202 and the lower branch 220 may comprise one or more corresponding intermediate filter blocks 208, 228. Each intermediate filter block 208 of the upper branch may be selectively coupled to either the output of a previous filter block of the upper branch 202 or to the output of the adder 242 through an input multiplexer 206. Each intermediate filter block 228 of the lower branch 220 may be selectively coupled to either the output of a previous filter block of the lower branch 220 or to the output of the upper branch 202 through an input multiplexer 226.

As described above the upper and lower branches 202, 220 comprise a plurality of corresponding filter blocks. The upper and lower filter blocks correspond in that the outputs from corresponding upper and lower filter blocks may be selected by the multiplexer 244 for combining by the combiner. For example, the output from the first filter block 204 of the upper branch 202 and the output from the first filter block of the lower branch 220 may be selected and combined by the adder 242 of the combiner.

The reconfigurable filter processor 200 allows the connections between filter blocks to be modified during use by applying appropriate signals to select the input for the various filter blocks as well as the input to the combiner. As described further below, the reconfigurable filter block can be used to realize multiple different filter topologies.

A controller 250 may receive a control input specifying the desired configuration of the reconfigurable filter processor. The controller 250 generates the appropriate signals (control signals) for configuring the reconfigurable filter processor 200. For example, the control input may specify a desired order of a LWDF section and an order of a serial cascaded section coupled to the LWDF section. The controller 250 receives the control input and determines the appropriate control signals necessary to configure the reconfigurable controller in accordance with the control input. The control signals may comprise signals for selecting the input of the multiplexers 206, 210, 226, 230 for the input to the filter blocks as well as the multiplexer 240 for selecting the inputs of the adder 242 as well as the output multiplexer 244 that selects the output of the reconfigurable filter processor 200. The control signals from the controller 250 are distributed to the multiplexers, or other components that configure the reconfigurable filter processor 200. The connections are not depicted in FIG. 2 for simplicity. The controller 250 may form part of the reconfigurable filter processor 200, or it may be a component external to the reconfigurable filter processor 200.

The configuration of the reconfigurable filter processor 200 may be specified by indicating the order of a LWDF (or parallel cascade of allpass sections—PCAS) section (N_pcas); an order of a serially cascaded all pass section (N_ap) and an order of FIR that the filter is to implement. N_pcas, N_ap, and N_fir may be used to control the mode of the first and second order hybrid filter blocks of the reconfigurable filter processor.

Figure 3:
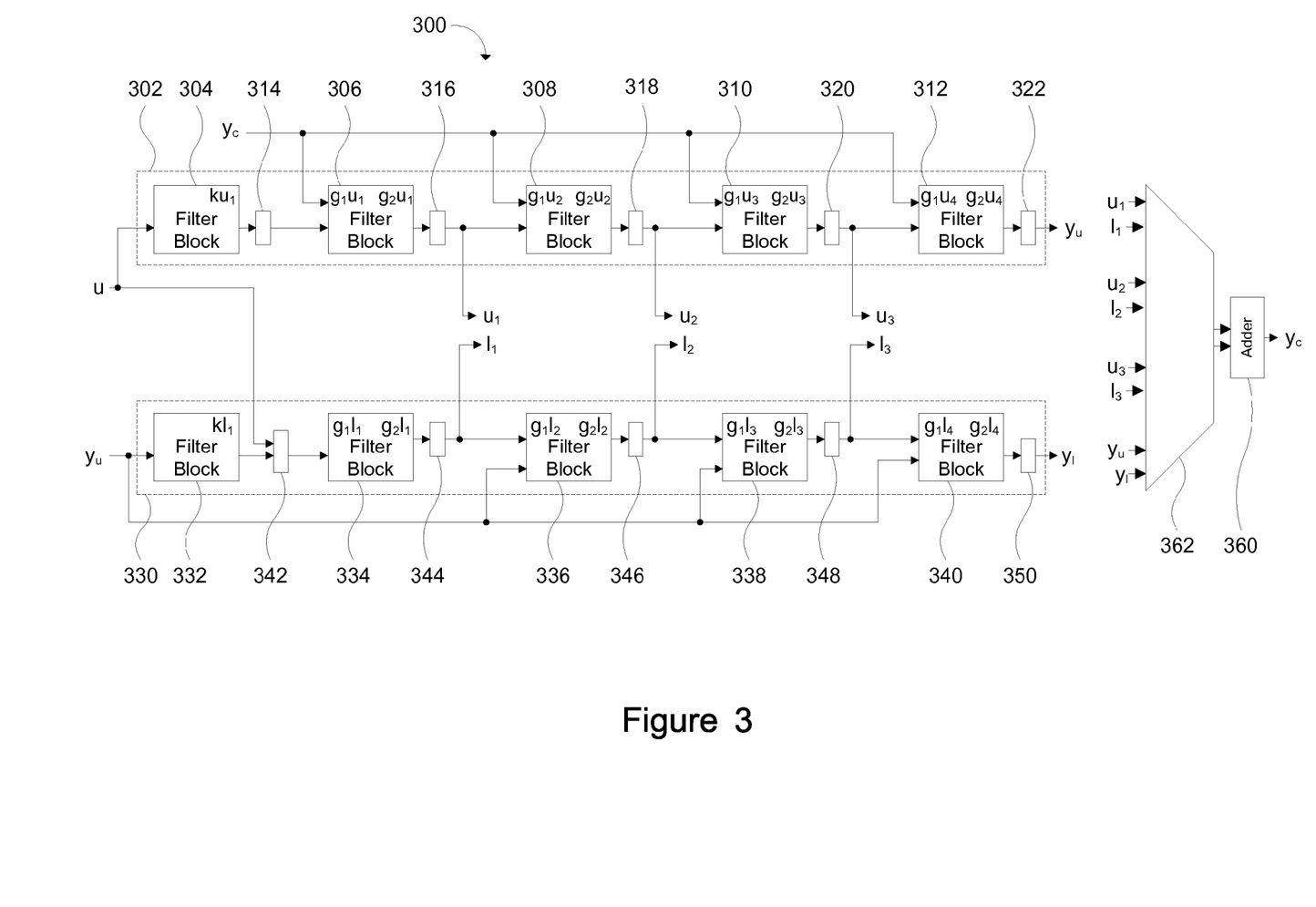
FIG. 3 depicts in a block diagram components of a reconfigurable filter processor.

FIG. 3 depicts in a block diagram components of a reconfigurable filter processor. The reconfigurable filter processor 300 comprises an upper branch 302 and a lower branch 330. A combiner combines outputs from pairs of filter blocks from the upper branch 302 and the lower branch 330. The combiner may comprise an adder 360 that selectively receives outputs from corresponding filter blocks of the upper and lower branches 302, 330 and combines the selected outputs, for example by adding ½ of each of the selected outputs together, to provide a combiner output $y_c$. The outputs may be selected by a multiplexer 362.

The upper branch comprises a plurality of filter blocks coupled together. The plurality of filter blocks comprise a first order filter block 304 and four second order filter blocks 306, 308, 310, 312. Each of the second order filter blocks can select either the output from a previous filter block or the combiner output $y_c$. The second order filter blocks may use a multiplexer (not shown) to select the input as depicted in FIG. 2. The reconfigurable filter processor 300 may also include a controller (not shown) similar to the controller 200 described above.

The first order filter block 304 may couple the input of the filter processor 300 to the first second order filter block 306 of the reconfigurable filter processor 300. The plurality of second order filter blocks are coupled together in a cascade. The output $y_u$ of the upper branch 302 is provided by the output of the last second order filter block 312.

The lower branch comprises a first order filter block 332 and a plurality of second order filter blocks 334, 336, 338, 340 cascaded together. The input to the filter processor 300 may be selectively coupled to the first second order filter block 334. The output $y_u$ of the upper branch may also be selectively coupled to the first second order filter block 334 through the first order filter block 332. The output of the lower branch 330 is provided by the output of the last second order filter block 340.

As depicted, the multiplexer 362 receives the output from corresponding second order filter blocks of the upper branch 302 and the lower branch 330. The output of the upper and lower branches 302, 330 are depicted as $u_x, l_x$, where x is the position of the respective second order filters in the cascade of the upper and lower branches 302, 330. The output from the last second order filter blocks 312, 340 of the upper and lower branches 302, 330 are depicted as $y_u$ and $y_l$. The multiplexer 362 selects corresponding outputs from the upper and lower branches and provides them to the adder 360. For example, the multiplexer 362 may select and provide the output from the first second order filter blocks 306, 334 $u_1, l_1$ to the adder 360.

In order to implement the serial cascaded filter blocks an overall transfer function is factored into a set of second order constituents. This can result in large signal variations at the nodes between the filter blocks. In order to control the signal variations, a coarse gain, for example factors of ½, may be selectively applied to the output of the filter blocks. The output from each filter block may be provided to a programmable gain unit 314, 316, 318, 320, 322, 342, 344, 346, 348, 350 prior to being input to the next filter block. The gain of the programmable gain units may be individually selected from a plurality of predetermined gains, for example 1, ½, ¼, etc.

Each of the filter blocks of the reconfigurable filter processor 300 is depicted as having one or more parameters. The parameters of each of the filter blocks may be set or changed during operation of the reconfigurable filter processor 300. For example, the first order filter blocks 304, 330 each have a single parameter indicated as $ku_1$ and $kl_1$. The second order filter blocks comprise two parameters $g_1u_x$, $g_2u_x$ for each of the upper second order filter blocks and $g_1l_x$, $g_2l_x$ for each of the lower second order filter blocks, where x is the position of the filter block within the serial cascade.

As set forth further below, the reconfigurable filter processor 200, 300 can implement different filter topologies by providing the appropriate signals to select the input to the different filter blocks.

Figure 4:
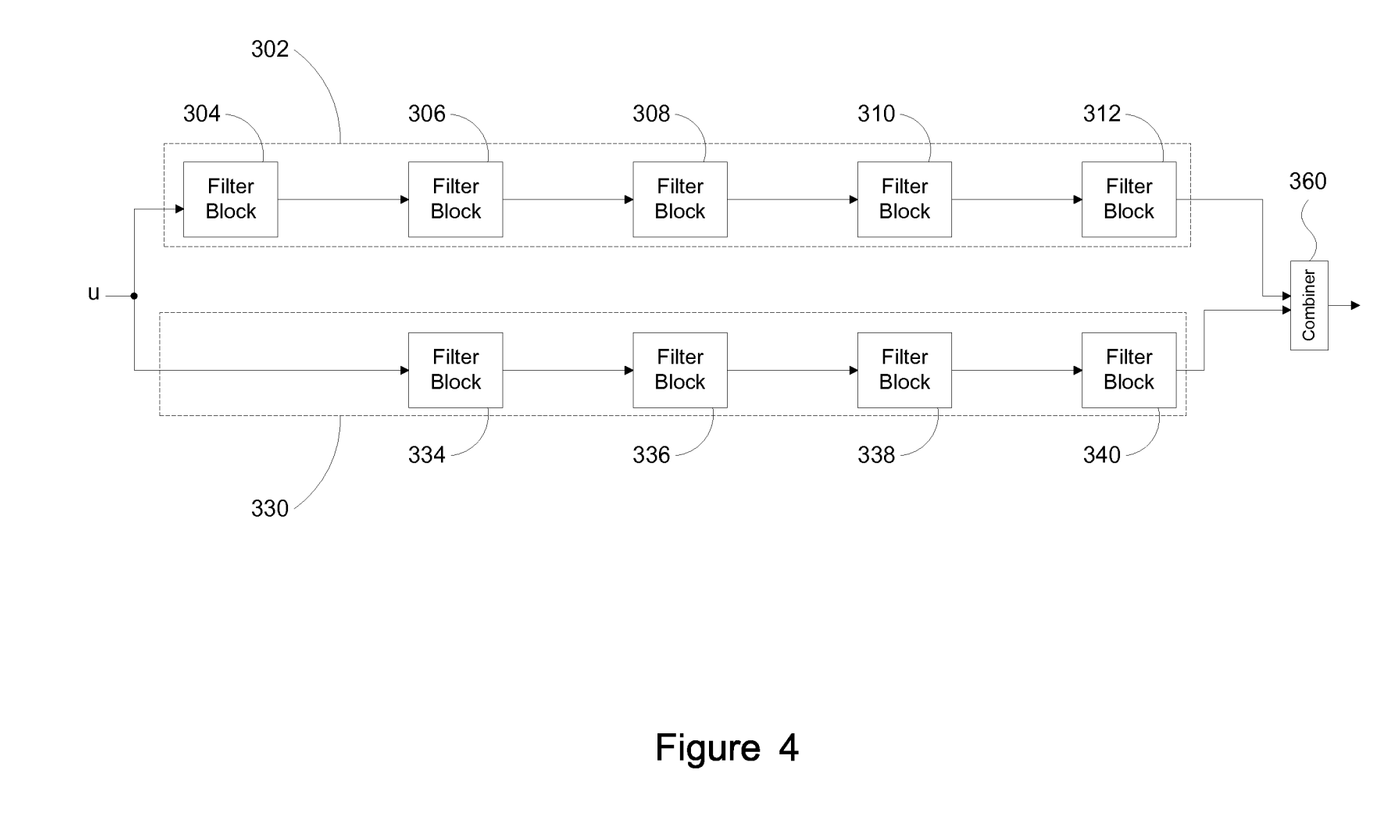
FIG. 4 depicts in a block diagram an illustrative configuration of a data path of the reconfigurable filter processor.

FIG. 4 depicts in a block diagram an illustrative configuration of a data path that can be realized by the appropriate configuration of the reconfigurable filter processor. The reconfigurable filter processor may be configured by appropriately applied control signals to provide an LWDF filter. The programmable gain units are not shown in FIG. 4 for simplicity. If each filter of the filter blocks is configured to select for the input the output from the previous filter block. The input to the reconfigurable filter processor is coupled to the first second order filter block 306 of the upper branch 302 through a first order filter block 304. The input is also coupled to first second order filter block 334 of the lower branch 330. The input to the second order filter blocks 308, 310, 312, 336, 338, 340 is the output from the previous second order filter blocks. The output of the filter blocks may be coupled to the other filter blocks through the programmable gain units. The outputs from the last second order filter blocks 312, 340 of the upper and lower branch 302, 330 are provided to the adder 360. The adder 360 combines the two outputs together, by adding ½ of each of the outputs together to generate the output of the reconfigurable filter processor.

As depicted in FIG. 4, the reconfigurable filter processor can provide a lattice digital wave filter topology. The individual parameters of the filter blocks may be individually controlled in order to tune the characteristics of the reconfigurable filter processor.

Figure 5:
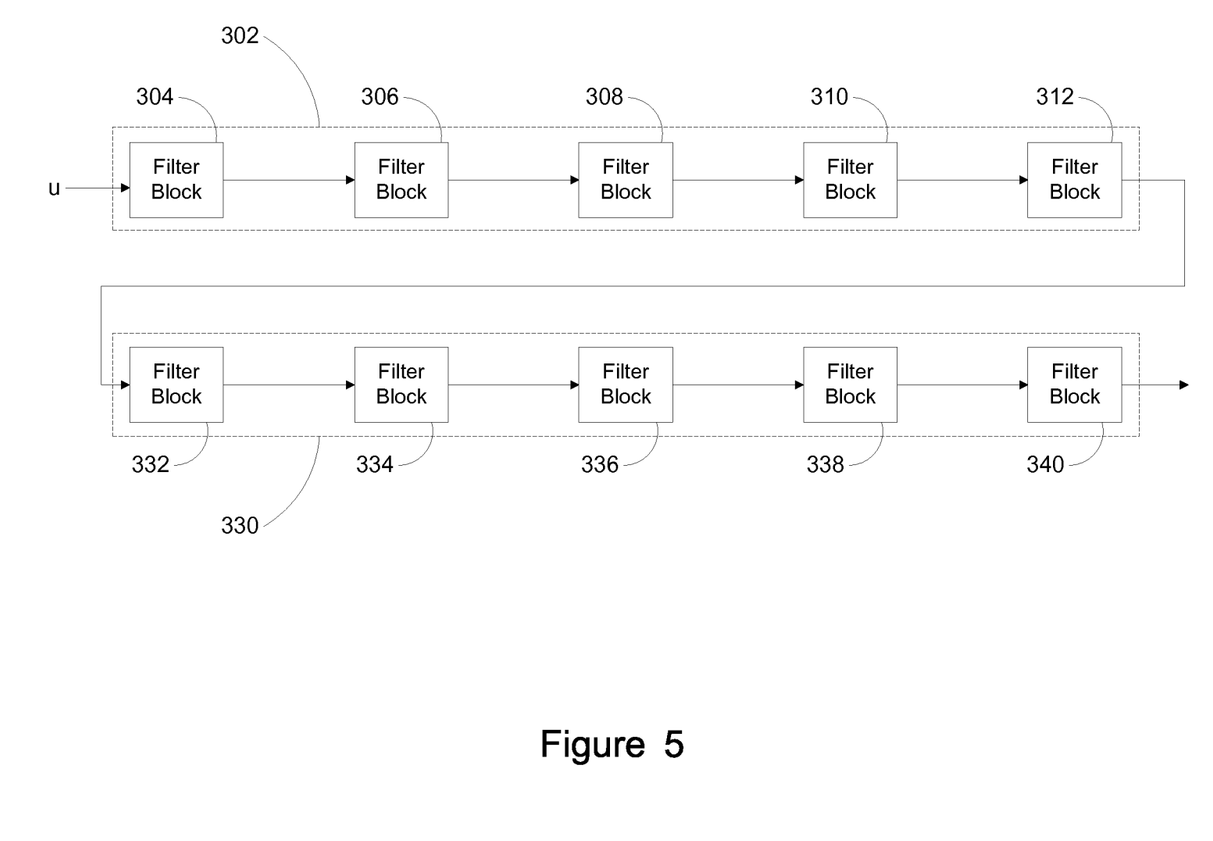
FIG. 5 depicts in a block diagram an illustrative configuration of a data path of the reconfigurable filter processor.

FIG. 5 depicts in a block diagram a further illustrative configuration of a data path that can be realized by the appropriate configuration of the reconfigurable filter processor. The reconfigurable filter processor may be configured by appropriately applied control signals to provide a serial cascade of filter blocks. The programmable gain units are not shown in FIG. 5 for simplicity. The filter topology of FIG. 5, which provides a serially cascaded filter block with an order of 18, can be implemented with the same reconfigurable processor used to implement the topology of FIG. 4. The input is provided to a first order filter block 304 of the upper branch 302. The input is cascaded through serially coupled filter blocks of the upper branch 302. The output of the upper branch is provided as input to the first order filter block 332 of the lower branch and is cascaded to the second order filter blocks. The output of the lower branch 330 is used as the output of the reconfigurable filter processor.

Figure 6:
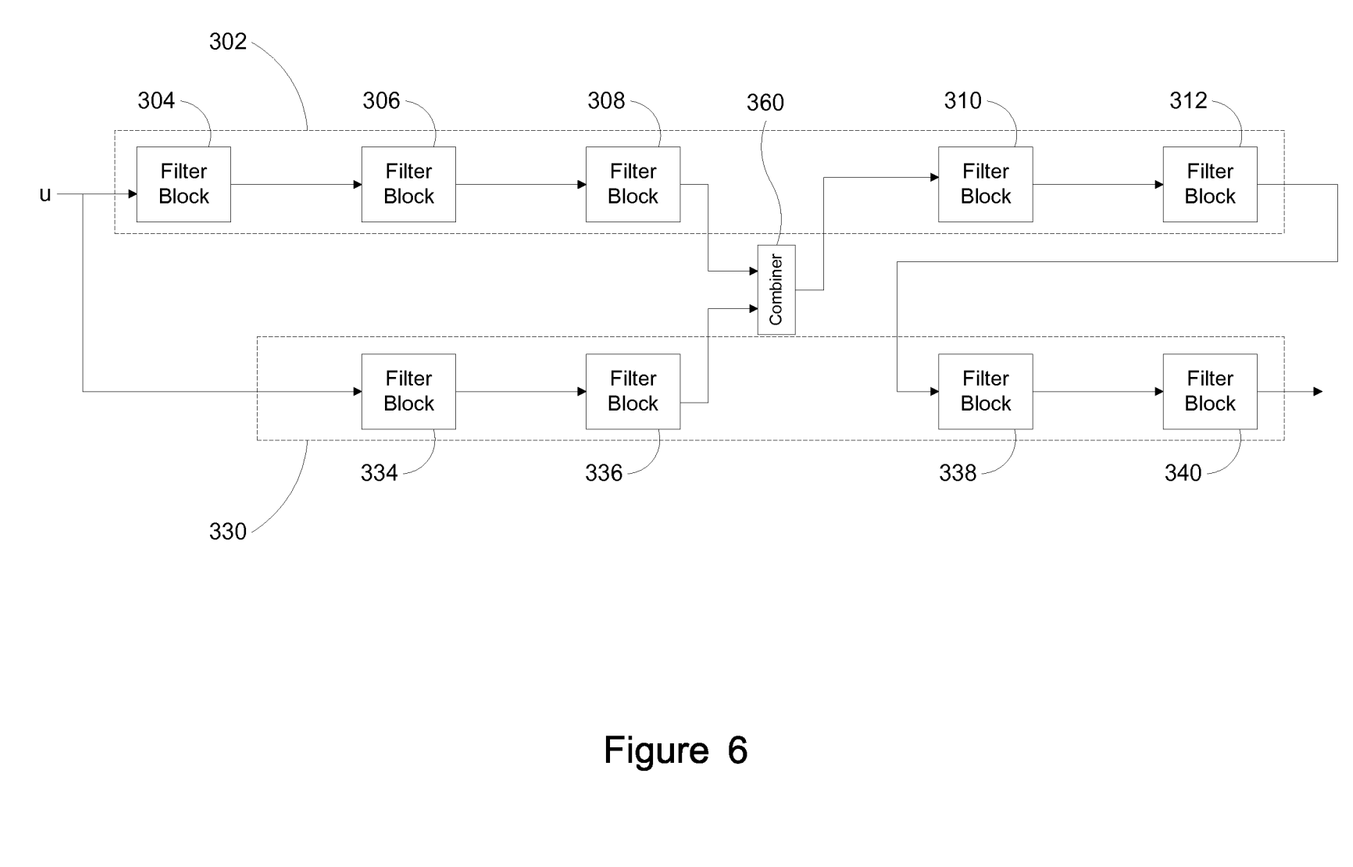
FIG. 6 depicts in a block diagram an illustrative configuration of a data path of the reconfigurable filter processor.

FIG. 6 depicts in a block diagram a further illustrative configuration of a data path that can be realized by the appropriate configuration of the reconfigurable filter processor. The reconfigurable filter processor may be configured by appropriately applied control signals. The programmable gain units are not shown in FIG. 6 for simplicity. The filter topology of FIG. 6, which provides a LWDF connected to a serial cascade of filter blocks, may be implemented with the same reconfigurable processor used to implement the topology of FIGS. 4 and 5. As described above, a LWDF may introduce phase non-linearity. The phase non-linearity of the LWDF section may be corrected by a serial cascaded section of filter blocks. The input to the reconfigurable filter is provided to the first order filter block 302 of the upper branch 302 and the first second order filter block 334 of the lower branch 330. The outputs of the second order filter blocks 306, 336 are provided to the adder 360, which combines the outputs. The output of the adder 360 is selected as the input to the second order filter block 308, which is cascaded to the last second order filter block 310 of the upper branch 302. The output of the upper branch 302 is selected as the input to the second order filter block 338 of the lower branch 330, which is cascaded to the second order filter block 340. The output of the filter block 340 of the lower branch 330 is selected as the output of the reconfigurable filter processor.

Figure 7:
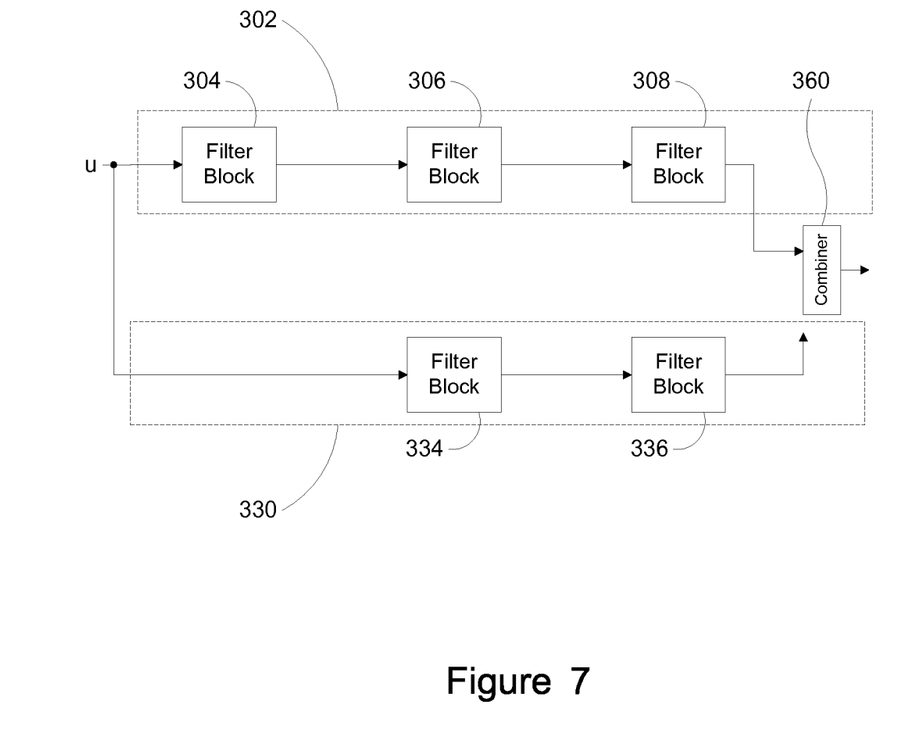
FIG. 7 depicts in a block diagram an illustrative configuration of a data path of the reconfigurable filter processor.

FIG. 7 depicts in a block diagram a further illustrative configuration of a data path that can be realized by the appropriate configuration of the reconfigurable filter processor. The reconfigurable filter processor may be configured by appropriately applied control signals. The programmable gain units are not shown in FIG. 7 for simplicity. The filter topology of FIG. 7, which provides a partial order LWDF, may be implemented with the same reconfigurable processor used to implement the topology of FIGS. 4, 5 and 6. The filter topology of FIG. 7 may only use a portion of the filter blocks to conserve power. The input to the reconfigurable filter is provided to the first order filter block 302 of the upper branch 302 and the first second order filter block 334 of the lower branch 330. The outputs of the second order filter blocks 306, 336 are provided to the adder 360, which combines the outputs. The output of the adder 360 is selected as the output of the reconfigurable filter processor.

The above description provides a reconfigurable filter processor 200, 300 that may implement a plurality of different filter topologies. The reconfigurable filter processors have been described with reference to connections between filter blocks. The filter blocks may provide an IIR or an FIR filter block. As described further below, additional flexibility may be provided by using a hybrid filter block that can provide both an IIR and FIR for the filter blocks.

Figure 8:
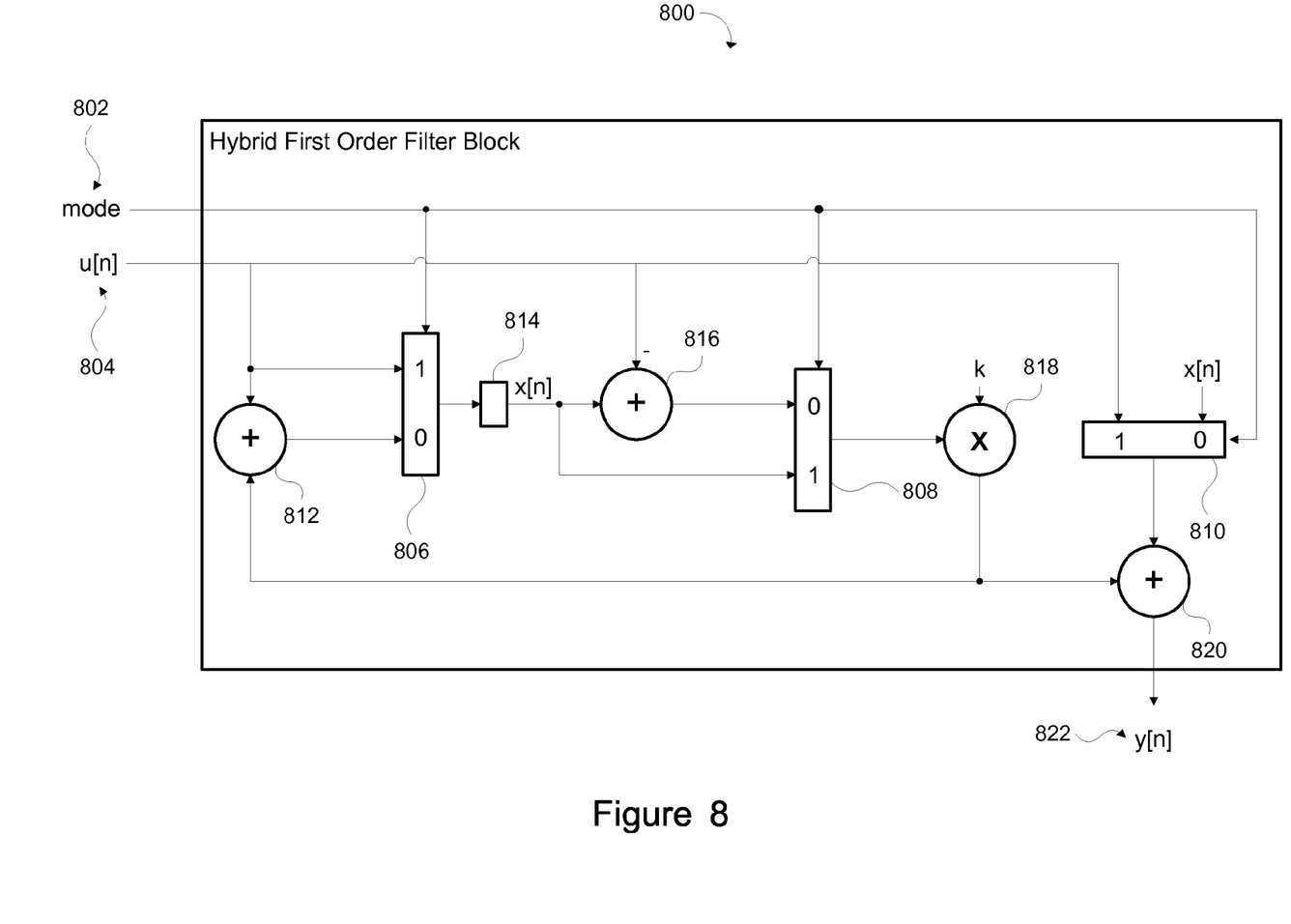
FIG. 8 depicts in a block diagram an illustrative first order hybrid filter block that may be used in the reconfigurable filter processor.

FIG. 8 depicts in a block diagram an illustrative first order hybrid filter block that may be used as one or more of the filter blocks in the reconfigurable filter processor. The first order hybrid filter block 800 can selectively implement a first order allpass filter that provides an IIR or a first order FIR. With regards to FIG. 8, $u[n]$ is a scalar input sample at time discrete time sample n, $x[n]$ is a scalar state variable at a discrete time sample n, k is a scalar programmable filter constant that can be set as a parameter of the filter block and $y[n]$ is a scalar output sample at time n.

The first order hybrid filter block 800 receives a mode input 802 and a signal input $u[n]$ 804. The mode input 802 controls a plurality of multiplexers 806, 808 and 810 that control the data path of the hybrid first order filter block 800. The hybrid first order filter block 800 also comprises a register 814 that provides a unit delay to the signal. The hybrid first order filter block 800 also comprises a plurality of adders 812, 816, 820 for adding signals together in the data path and a multiplier 818 for multiplying a signal by a parameter k to produce an output $y[n]$ 822.

The 2-to-1 multiplexers 806, 808, 810 are controlled by the 'mode' input signal. For example, when the mode is '1' the FIR datapath is selected and when the mode is '0' the IIR datapath is selected.

The following equations define the first order hybrid filter block when operating in the IIR mode:

$$x[n+1]=k*x[n]+(1-k)*u[n]$$

$$y[n]=(1+k)*x[n]-k*u[n]$$

The following equation defines the first order hybrid filter block when operating in the FIR mode:

$$y[n]=u[n]+k*u[n-1]$$

Figure 9:
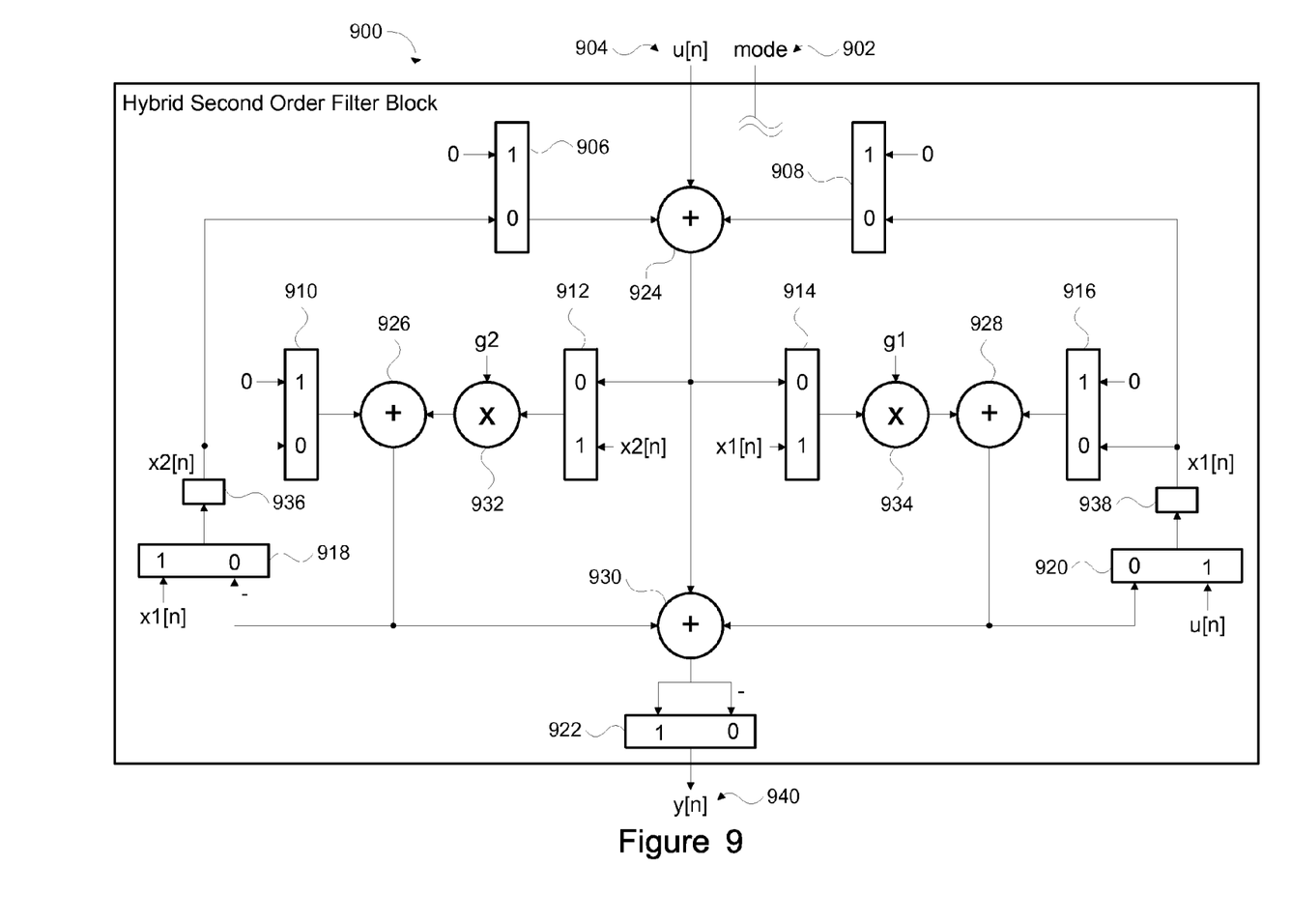
FIG. 9 depicts in a block diagram an illustrative second order hybrid filter block that may be used in the reconfigurable filter processor.

FIG. 9 depicts in a block diagram an illustrative second order hybrid filter block that may be used in the reconfigurable filter processor. The second order hybrid filter can selectively implement a second order allpass filter that provides an IIR or a second order FIR. With regards to FIG. 9, $u[n]$ is a scalar input sample at time n, $x[n]$ is a vector state variable $[x_1 x_2]^{Transpose}$, $g_1$ and $g_2$ are scalar programmable filter constants, and $y[n]$ is a scalar output sample at time n.

The second order hybrid filter block 900 receives a mode input 902 and a signal input $u[n]$ 904. The mode input 902 controls a plurality of multiplexers 906, 908, 910, 912, 914, 916, 918, 920 and 922 that control the data path of the hybrid second order filter block 900. The hybrid second order filter block 900 also comprises a plurality of registers 936 and 938 that provide a unit delay to the signal. The hybrid second order filter block 900 also comprises a plurality of adders 924, 926, 928 and 930 for adding signals together in the data path and multipliers 932 and 934 for multiplying a signal by a parameter g2 and g1 respectively to produce an output $y[n]$ 822.

The following equations define the second order hybrid filter block when operating in the IIR mode:

$$x[n+1]=A*x[n]+b*u[n]$$

$$y[n]=c*x[n]+d*u[n]$$

Where:
$A=[[(1+g_1)g_1];[-g_2(-g_2-1)]]$–a 2×2 matrix
$b=[g_1(-g_2)]^{Transpose}$
$c=[(-2-g_1-g_2)(-2-g_1-g_2)]$
$d=-1-g_1-g_2$ The following equation defines the second order hybrid filter block when operating in the FIR mode:

$$y[n]=u[n]+g_1*u[n-1]+g_2*u[n-2]$$

As described above with reference to FIGS. 8 and 9, the hybrid filter blocks 800 and 900 include parameters for configuring the transfer function of the hybrid filter block. The hybrid first order filter block 800 has a single parameter 'k', while the hybrid second order filter block 900 comprises two parameters $g_1$ and $g_2$. By proper selection of the parameters of the hybrid second order filter block, it is possible to configure a second order filter as a first order filter.

Figure 10:
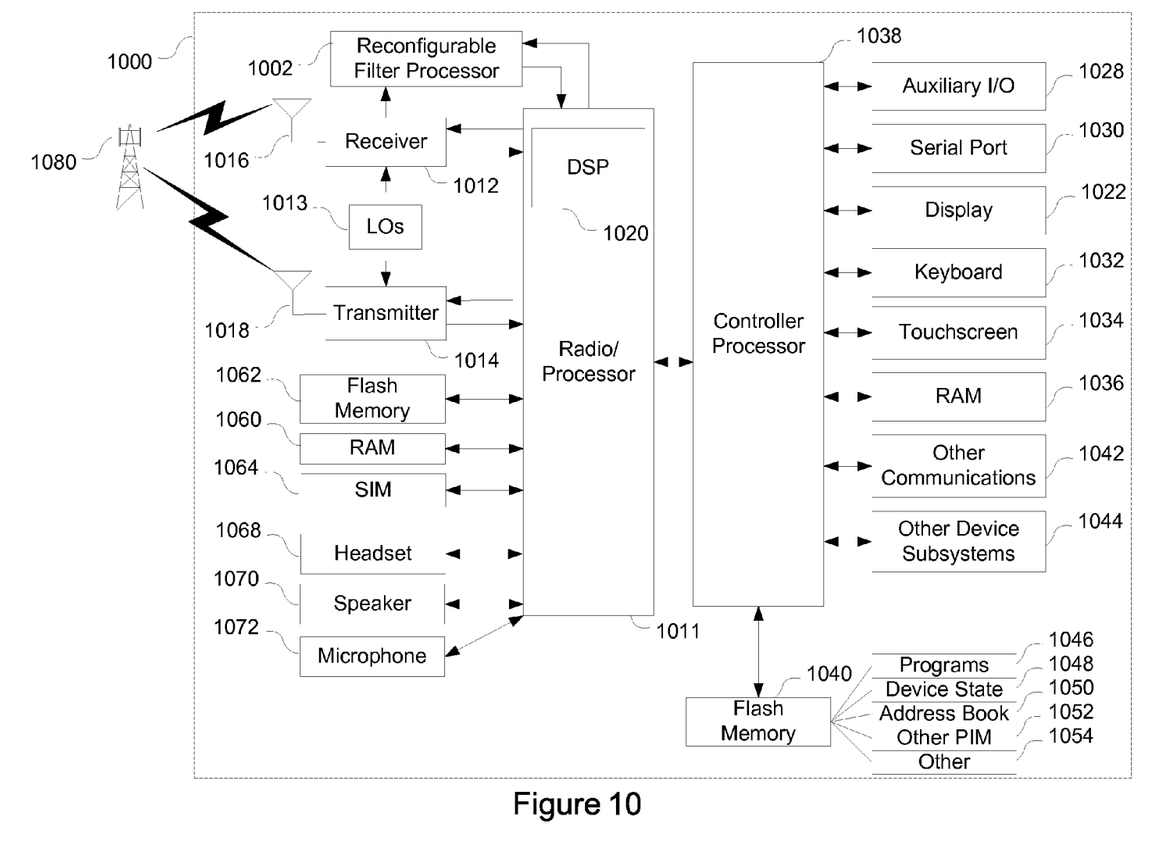
FIG. 10 depicts in a block diagram a system comprising a reconfigurable filter processor.

FIG. 10 is a block diagram of a communication device that may utilize a digital signal filter processing unit, in particular a wireless device 1000 is shown incorporating a communication subsystem having both a receiver 1012 and a transmitter 1014, a reconfigurable filter processor 1002, such as filter processor 200 or 300, as well as associated components such as one or more embedded or internal antenna elements 1016 and 1018, local oscillators (LOs) 1013, and a processing module such as a digital signal processor (DSP) 1020. The particular design of the communication subsystem will be dependent upon the communication network in which the device is intended to operate such as iDEN, CDMA, EV-DO, UTMS, HSPDA, GSM, EDGE, GPRS, and 3GPP LTE networks. However, the reconfigurable filter processor 1002 may be configured to provide adequate processing for providing the filtering required by the particular network. The reconfigurable processor 1002 is shown as a discrete processor however the filter processor may be incorporated as a processing unit as part of an ASIC, FPGA, DSP or other processing device.

When required network registration or activation procedures have been completed, wireless device 1000 may send and receive communication signals over a wireless network 1080. Signals received by antenna 1016 through communication network 100 are input to receiver 1012, which may perform such common receiver functions as signal amplification, frequency down conversion, channel selection and the like. The receiver 1012 may utilize the reconfigurable processor 1002 to provide filtering of the signals. The reconfigurable processor 1002 may be an independent processor or incorporated in the receiver 1012 or Radio/processor 1011

In a similar manner, signals to be transmitted are processed, including modulation and encoding for example, by DSP 1020 and input to transmitter 1014 for digital to analog conversion, frequency up conversion, filtering, amplification and transmission over the communication network 1080 via antenna 1018. DSP 1020 not only processes communication signals, but also provides for receiver and transmitter control. For example, the gains applied to communication signals in receiver 1012 and transmitter 1014 may be adaptively controlled through automatic gain control algorithms implemented in DSP 1020.

Wireless device 1000 preferably includes a radio processor 1011 and a control processor 1038 which together control the overall operation of the device. DSP 1020 is located on radio processor 1011. Communication functions are performed through radio processor 1011.

Radio processor 1011 interacts with receiver 1012 and transmitter 1014, and further with flash memory 1062, random access memory (RAM) 1060, the subscriber identity module 1064, a headset 1068, a speaker 1070, and a microphone 1072.

Microprocessor 1038 interacts with further device subsystems such as the display 1022, flash memory 1040, random access memory (RAM) 1036, auxiliary input/output (I/O) subsystems 1028, serial port 1030, keyboard 1032, input devices such as a touch screen or touch input device 1034, other communications 1042 and other device subsystems generally designated as 1044.

Some of the subsystems shown in FIG. 10 perform communication-related functions, whereas other subsystems may provide "resident" or on-device functions. Notably, some subsystems, such as keyboard 1032 and display 1022, for example, may be used for both communication-related functions, such as entering a text message for transmission over a communication network, and device-resident functions such as a calculator or task list. Additionally certain components may be combined, for example, the keyboard 1032 and the display 1022 may be combined as a single component such as a touch screen.

Software used by radio processor 1011 and microprocessor 1038 is preferably stored in a persistent store such as flash memory 1040 and 1062, which may instead be a read-only memory (ROM) or similar storage element (not shown). Those skilled in the art will appreciate that the operating system, specific device applications, or parts thereof, may be temporarily loaded into a volatile memory such as RAM 1036 and RAM 1060. Received communication signals may also be stored in RAM 1036.

As shown, flash memory 1040 can be segregated into different areas for computer programs 1046, device state 1048, address book 1050, other personal information management (PIM) 1052 and other functionality generally designated as 1054. These different storage types indicate that each program can allocate a portion of flash memory 1040 for their own data storage requirements. Microprocessor 1038, in addition to its operating system functions, preferably enables execution of software applications on the wireless device For voice communications, overall operation of wireless device 1000 is similar, except that received signals would preferably be output to the speaker 1070 or headset 1068 and signals for transmission would be generated by the microphone 1072. Alternative voice or audio I/O subsystems, such as a voice message recording subsystem, may also be implemented on wireless device 1000.

Other device subsystems 1044, such as a short-range communications subsystem, is a further optional component which may provide for communication between wireless device 1000 and different systems or devices, which need not necessarily be similar devices. For example, the subsystem 1044 may include an infrared device and associated circuits and components or a Bluetooth™ communication module to provide for communication with similarly enabled systems and devices.

Figure 11:
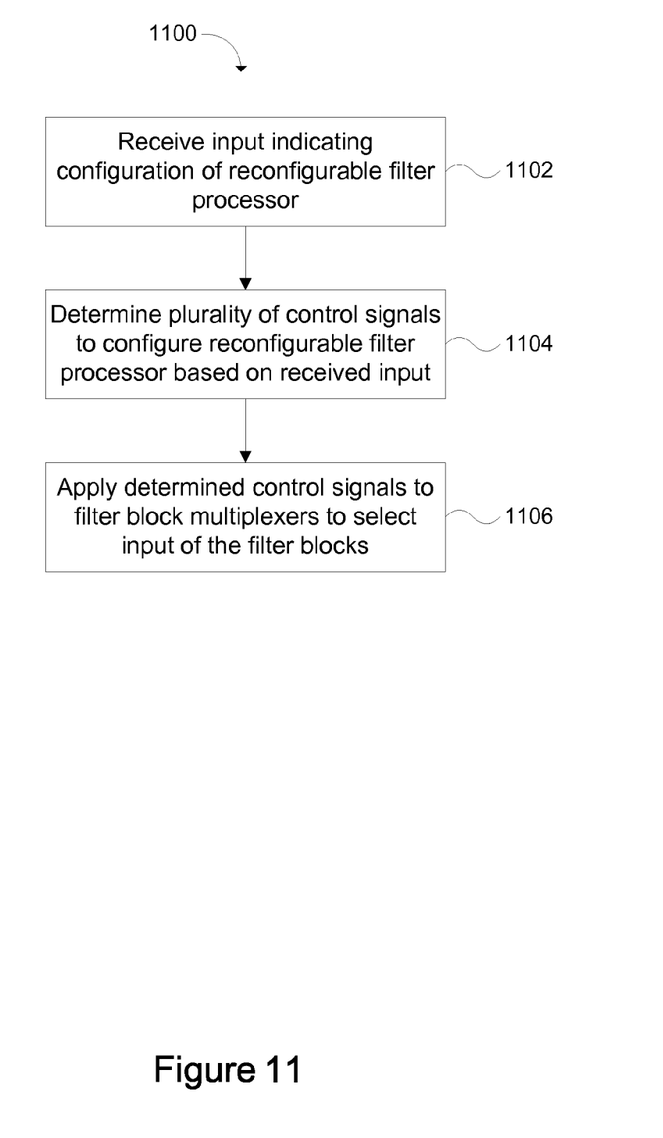
FIG. 11 depicts in a flow chart a method of reconfiguring a filter processor.

FIG. 11 depicts in a flow chart a method of reconfiguring a filter processor. The method 1100 receives an input that indicates an order of a lattice wave digital filter section and an order of a serial cascade filter section (1102). The combined order of the LWDF section and the serial cascade is at most the sum of the order of the individual filter blocks of the reconfigurable filter. The input may also specify a mode of the filter blocks, for example either IIR or FIR. The method determines, based on the input, a plurality of control signals required for coupling a plurality of filter blocks together to provide the filter sections specified by the input (1104) and applies the determined control signals to respective filter block multiplexers, each filter block multiplexer associated with one of the plurality of filter blocks and for selecting an input of the filter block (1106).

The device and methods according to the present disclosure may be implemented by any hardware, software or a combination of hardware and software having the above described functions. The software code, either in its entirety or a part thereof, may be stored in a computer-readable memory. Further, a computer data program representing the software code may be embodied on a computer-readable memory. Although the receiver is described in terms of units, the functions of the receiver may be integrated in to other components of the device such as the receiver, decoder or digital processors.

While a particular embodiment of the present device and methods for providing a digital signal processor has been described herein, it will be appreciated by those skilled in the art that changes and modifications may be made thereto without departing from the disclosure in its broadest aspects and as set forth in the following claims. Although an embodiment is provided in regards to a wireless application the digital signal processing unit may be utilized in a digital communication path utilizing digital communications such as but not limited to wired, optical or control applications requiring digital signal processing of the received signals.

What is claimed is:

1. A reconfigurable digital signal filter processing unit comprising:
an input filter block for applying an input transfer function to an input to the reconfigurable digital signal filter processing unit and generating a filter block output according to the input transfer function;
a plurality of filter blocks each for applying a transfer function to a filter block input and generating a filter block output according to the respective transfer function;
a combiner for selectively combining filter block outputs from at least two filter blocks of the plurality of filter blocks and generating a combiner output;
wherein the respective filter block input of each of the plurality of filter blocks is selectively coupled to:
a filter block output of one of the plurality of filter blocks or the filter block output of the input filter block; and
the combiner output.

2. The reconfigurable digital signal filter processing unit of claim 1, wherein the input filter block is a first order filter.

3. The reconfigurable digital signal filter processing unit of claim 1, wherein each of the plurality of filter blocks is a second order filter block.

4. The reconfigurable digital signal filter processing unit of claim 1, comprising an even number of filter blocks arranged in a first branch and a second branch, each branch having the same number of filter blocks, wherein the input filter block is located in the first branch.

5. The reconfigurable digital signal filter processing unit of claim 4, wherein the combiner selectively combines filter block outputs from a filter block of the first branch and a corresponding filter block of the second branch.

6. The reconfigurable digital signal filter processing unit of claim 5, further comprising a connecting filter block for applying a connecting transfer function to a filter block output of the upper branch.

7. The reconfigurable digital signal filter processing unit of claim 6, further comprising a plurality of filter blocks in each of the first and second branches, wherein the output of the input filter block is selectively coupled to a first filter block of the first branch, and the filter block inputs of the remaining filter blocks of the first branch are selectively coupled to a respective output of a previous filter block in the first branch, the connecting filter block is coupled to the output of the last filter block of the first branch and the filter block inputs of the remaining filter blocks of the second branch are selectively coupled to a respective output of a previous filter block in the second branch.

8. The reconfigurable digital signal filter processing unit of claim 7, wherein each of the filter blocks of the first branch are selectively coupled to the combiner output and each of the filter blocks of the second branch are selectively coupled to the output of the last filter block of the first branch.

9. The reconfigurable digital signal filter processing unit of claim 8, further comprising a plurality of multiplexers, each of the multiplexers associated with a respective filter block, the multiplexers associated with filter blocks arranged in the first branch for selectively coupling the respective filter block input to the output of a previous filter block of the first branch and the combiner output, the multiplexers associated with filter blocks arranged in the second branch for selectively coupling the respective filter block input to the output of the last filter block of the first branch and the output of a previous filter block of the second branch.

10. The reconfigurable digital signal filter processing unit of claim 1, further comprising a plurality of multiplexers, each of the multiplexers for selectively coupling inputs to respective filter blocks.

11. The reconfigurable digital signal filter processing unit of claim 9, wherein each filter block comprises one of the plurality of multiplexers.

12. The reconfigurable digital signal filter processing unit of claim 1, further comprising a plurality of programmable gain units coupled to the output of the plurality of filter blocks and the input filter block.

13. The reconfigurable digital signal filter processing unit of claim 1, wherein one or more of the plurality of filter blocks and the input filter block is a hybrid first order filter block selectively applying an infinite impulse response first order transfer function to the filter block input or a finite impulse response first order transfer function to the filter block.

14. The reconfigurable digital signal filter processing unit of claim 1, wherein one or more of the plurality of filter blocks is a hybrid second order filter block selectively applying an infinite impulse response second order transfer function to the filter block input or a finite impulse response second order transfer function to the filter block.

15. A reconfigurable digital signal filter processing unit for producing a filtered output from an input, the processing unit comprising:
    a. a first filter block coupled the input and providing an output (U0) according to a first transfer function;
    b. a second filter block selectably receiving one of U0 and an alternate input (Yc) and providing an output (Un) according to a second transfer function;
    c. a third filter block selectably receiving one of the input and Un and providing an output (L0) according to a third transfer function;
    d. a fourth filter block selectably receiving one of L0 and Un and providing an output (L1) according to a fourth transfer function; and
    e. a combiner selectably combining U0 with L0 or U1 with L1 to provide the alternate input Yc, the alternate input Yc coupled to the output.

16. The reconfigurable digital signal filter processing unit of claim 15, wherein each of the first, second, third and fourth transfer functions are second order filter blocks.

17. The reconfigurable digital signal filter processing unit of claim 16, further comprising a first order filter block coupling the first filter block to the input and applying a first order transfer function to the input.

18. The reconfigurable digital signal filter processing unit of claim 17, further comprising a plurality of programmable gain units, each coupled to a respective output of the first, second, third and fourth filter blocks and the first order filter block.

19. A method of reconfiguring a digital signal filter processing unit comprising:
    receiving an input indicating an order of a lattice wave digital filter (LWDF) section and a serial cascaded filter section;
    determining a plurality of control signals required for coupling a plurality of filter blocks together to provide the filter sections specified by the input; and
    applying the determined control signals to respective filter block multiplexers, each filter block multiplexer associated with one of the plurality of filter blocks and for selecting an input of the filter block.

20. The method of claim 19, further comprising:
    setting respective gains of a plurality of programmable gain units coupled to respective outputs of each of the plurality of filter blocks.

* * * * *